US005449964A

United States Patent [19]

Snyder

[11] Patent Number: 5,449,964

[45] Date of Patent: Sep. 12, 1995

[54] TRIGGERING TRANSDUCER APPARATUS FOR ACOUSTIC DEVICE

[76] Inventor: Michael J. Snyder, 9454 SW. Ochoco Dr., Tualatin, Oreg. 97062

[21] Appl. No.: 247,573

[22] Filed: May 23, 1994

[51] Int. Cl.[6] .......... H01L 41/08

[52] U.S. Cl. .......... 310/330; 310/327; 310/345

[58] Field of Search .......... 310/330, 334, 327, 345

[56] References Cited

U.S. PATENT DOCUMENTS

| | | | |
|---|---|---|---|
| 2,777,016 | 1/1957 | Wood | 310/330 X |
| 2,879,413 | 3/1959 | Johannsen | 310/330 X |
| 2,955,170 | 10/1960 | Dieter, Jr. et al. | 310/330 X |
| 3,043,921 | 7/1962 | Hester | 310/330 X |
| 3,108,161 | 10/1963 | Tourtellot | 310/330 X |
| 3,433,487 | 3/1969 | Kawaguchi et al. | 310/330 X |
| 3,725,561 | 4/1973 | Paul | 84/1.15 |
| 4,012,604 | 3/1977 | Speidel | 310/330 X |
| 4,054,808 | 10/1977 | Tanaka | 310/326 X |
| 4,110,654 | 8/1978 | Paul | 310/330 X |
| 4,538,139 | 8/1985 | Clemente | 310/330 X |
| 4,837,836 | 6/1989 | Barcus | 381/118 |
| 4,984,498 | 1/1991 | Fishman | 84/730 |
| 5,036,742 | 8/1991 | Youakim | 84/411 R |
| 5,134,920 | 8/1992 | Clark | 84/730 |
| 5,136,202 | 8/1992 | Carenzo et al. | 310/330 |

FOREIGN PATENT DOCUMENTS

| | | |
|---|---|---|
| 0248528 | 12/1987 | European Pat. Off. . |
| 0542706 | 5/1993 | European Pat. Off. . |
| 468298 | 12/1992 | Sweden . |
| 469733 | 5/1993 | Sweden . |
| 9003639 | 4/1990 | WIPO . |

OTHER PUBLICATIONS

"The Next Generation in Drum Triggers", Trigger Perfect, Tualatin, Orev.; 4 pp.; 1994.

"1993 Drum Trigger Line and Triggering Guide"; Trigger Perfect, Pasadena, Calif.; 8 pp.; 1993.

*Primary Examiner*—Mark O. Budd

*Attorney, Agent, or Firm*—Sheldon & Mak

[57] ABSTRACT

Disclosed is a triggering transducer for signaling external equipment from an acoustic device having a foundational structure and an acoustic member, The transducer includes a base for mounting to the foundational structure; an elastic beam member having an anchor portion supported relative to the base and having a beam extremity for limited area contact with the acoustic member; a piezoelectric element attached to the beam member between the beam extremity and the anchor portion for coupling bending strain from the beam member to the piezoelectric element in response to vibration of the acoustic member, the piezoelectric element being in proximate facing contact with an active portion of the beam member, the active portion being inclined at an angle $\theta$ from the acoustic member, the angle $\theta$ is between approximately 30° and approximately 45°; a first resilient member bonded over substantially the entire face area of the piezoelectric element for damping the element, the beam member being U-shaped between the anchor portion and the active portion, the first resilient member being located between the active and anchor portions of the beam member and connecting the anchor portion of the beam member; an arm member, the arm member being adjustably fixable relative to the base; and a second resilient member supportively connecting the anchor portion of the beam member to the arm member.

16 Claims, 3 Drawing Sheets

TRIGGERING TRANSDUCER APPARATUS FOR ACOUSTIC DEVICE

BACKGROUND

The present invention relates to electrical triggering devices, and more particularly to transducers for synchronizing external equipment with acoustic devices such as musical instruments and the like.

Triggering devices for use with musical instruments are known, being disclosed, for example, in U.S. Pat. Nos. 5,036,742 to Youakim, and 5,134,920 to Clark. Many such triggering devices of the prior art have a piezoelectric transducer element in facing contact with an acoustic member such as a drumhead, the element being pressed against the acoustic member by a foam pad that is clamped by a rigid supporting structure, the structure being anchored to a stationary member such as a drum clamp ring.

Triggering devices for musical instruments are subject to a number of disadvantages, including undesired dampening of the natural sound of the instrument, marginal signal amplitude for effective and uniform triggering, and frequency response that is incompatible with reliable response to fundamental sound frequencies that are produced by the particular instrument. When several instruments are being played it is commonly desired to trigger external equipment from drums, because it is customary to synchronize the playing of the other instruments being played to drum beats. Thus many trigger applications are for drum triggers.

Drum triggers of the prior art include those having a transducer element such as a piezoelectric device in direct contact with the drum head, and those having the transducer device isolated from the head by a resilient material such as foam rubber. Prior art triggers having full face contact between a piezoelectric element (or its adjacent support structure) and the drum head typically make contact with 0.3 square inches or more of the head, resulting in undesirable dampening or muffling of the drum. Also, high frequency components of the output signal having significant amplitude are undesirably out of phase with fundamental components, resulting in faulty trigger timing. Triggers having edge contact with the piezoelectric element have been introduced, but these exhibit inadequate excitation of the element with respect to both the amplitude and shape of the output waveform.

The prior art examples having the resilient material between the element and the head produce excessively low output amplitude unless the contact area and/or pressure is unacceptably high.

Thus there is a need for an acoustic triggering device for electronic equipment that provides high output amplitude without excessive muffling or dampening of the acoustic source, that does not produce faulty timing as a result of high frequency signal components, that is easy to use with a variety of acoustic sources, and is inexpensive to provide.

SUMMARY

The present invention meets this need by exciting a piezoelectric element in bending using a narrow supporting strip, a major portion of the strip including an attachment of the element being spaced above an acoustic source, an end extremity of the strip having limited area contact with the source. In one aspect of the invention, a triggering transducer includes a base for mounting to a foundational structure of an acoustic device, an elastic beam member having an anchor portion supported relative to the base and having a beam extremity for limited area contact with an acoustic member of the acoustic device, and a piezoelectric element attached to the beam member between the beam extremity and the anchor portion for coupling bending strain from the beam member to the piezoelectric element in response to vibration of the acoustic member.

Preferably the piezoelectric element extends laterally on opposite sides of the beam member for enhanced dynamic response of the element. The element can form a circular piezoelectric wafer having a diameter D and having facing proximate contact with the beam member over a width W of the beam member, the width W being not more than approximately 50 percent of the diameter D. The width W can be approximately half of the diameter D. The beam member can have a beam width between the anchor portion and the beam extremity, the piezoelectric element having an element width in the direction of the beam width, the beam width being approximately half of the element width.

The piezoelectric element can be in proximate facing contact with an active portion of the beam member, the active portion being inclined at an angle $\theta$ from the acoustic member. Preferably the transducer further includes a first resilient member connected to the piezoelectric element or to the active portion of the beam member proximate the piezoelectric element, for damping the element.

The beam member can be U-shaped between the anchor portion and the active portion, the first resilient member being located between the active and anchor portions of the beam member and connecting the anchor portion of the beam member or structure fixedly associated with the anchor portion. The first resilient member can include a foam material. The first resilient member can be bonded over substantially the entire face area of the piezoelectric element. Preferably the angle $\theta$ is between approximately 30° and approximately 45° for a desired combination of high output of the device with low damping or muffling of the acoustic device. More preferably the angle $\theta$ is approximately 35°.

Preferably the transducer includes an arm member adjustably fixable relative to the base for use with a variety of acoustic devices, the beam member being supported relative to the arm member. Preferably the transducer further includes a second resilient member connecting the anchor portion of the beam member to the arm member for further enhancing signal clarity. The second resilient member can include a foam patch.

DRAWINGS

These and other features, aspects, and advantages of the present invention will become better understood with reference to the following description, appended claims, and accompanying drawings, where:

DESCRIPTION

Figure 2:
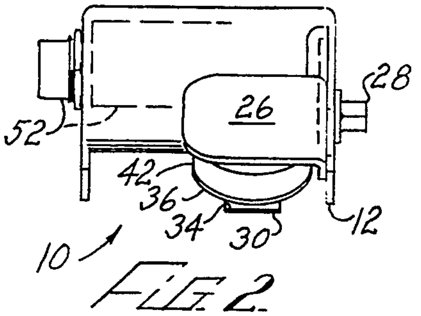
FIG. 2 is a front elevational view of the device of FIG. 1.
Figure 1:
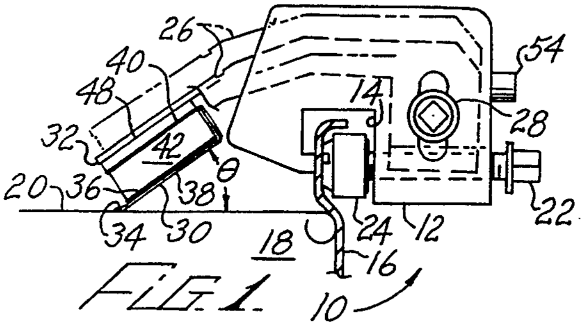
FIG. 1 is a right side elevational view of an electrical trigger device for use on an acoustic source, according to the present invention, the device being installed on an acoustic drum.
Figure 4:
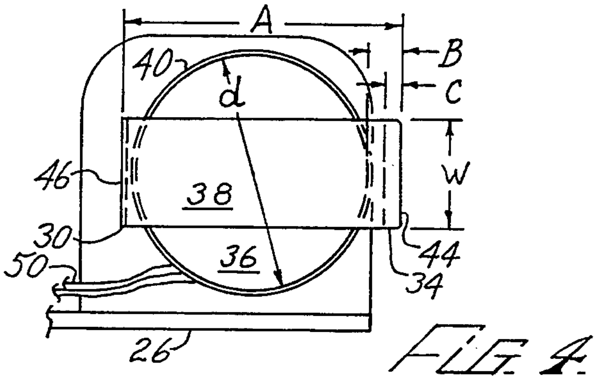
FIG. 4 is a oblique plan view of the device portion of FIG. 3 in the direction of line 4—4 therein.
Figure 3:
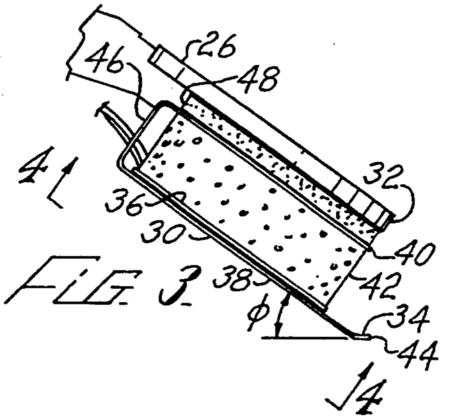
FIG. 3 is a left side detail view of a portion of the device of FIG. 1.

The present invention is directed to a transducer for producing an electronic signal in response to an acoustic device that is particularly suitable for triggering external equipment. With reference to FIGS. 1–5 of the drawings, a trigger device 10 in an exemplary form of the present invention includes a frame member 12 having a slot 14 formed therein for receiving a foundational member of the acoustic device, namely a bezel ring 16 of an acoustic drum 18, the drum 18 having a tensioned sheet head 20 that forms an acoustic source when struck by a suitable instrument (not shown). A clamp screw 22 is threadingly supported relative the frame member for clamping the bezel ring 16 against one side of the slot 14 for anchoring the frame member relative to the drum, the screw 22 having a shoe 24 affixed thereon for protection of the bezel ring 16. Thus the frame member 12 provides a stationary base of the device 10. An arm member 26 is adjustably fixably connected to the frame member 12 by an arm screw 28, an elastic beam member 30 being supported proximate an arm end extremity 32 of the arm member 26 and having a foot portion 34 for contacting the head 20.

A piezoelectric element 36 is affixed to an active portion 38 of the beam member 30 for providing an electronic signal in response to bending of the beam member 30 resulting from dynamic loading of the foot portion 34 by vibration of the drum head 20. The active portion 38 extends from proximate the foot portion 34 upwardly at an angle Θ from the drum head 20 for preventing area contact between the piezoelectric element 36 and the head 20, thereby avoiding or greatly attenuating damping of the head 20 by the device 10. The angle Θ is preferably between 30° and 45° for enhanced excitation of the piezoelectric element with minimal damping of the head 20. The beam member 30, which can be made from thin sheet metal, is formed in a U-shaped longitudinal profile, an anchor portion 40 being oriented approximately parallel to the active portion 38 and supported relative to the arm member 26 as described below. In further accordance with the present invention, a first resilient member 42 is located between the piezoelectric element 36 and the anchor portion 40 of the beam member 30 for damping unwanted high-frequency flexures of the element 36. In the configuration depicted in the drawings, the element 36 is bonded to the active portion 38 on the side thereof facing the anchor portion 40, the first resilient member 42 having full face contact with a back side of the piezoelectric element 36. As shown most clearly in FIG. 4, the element 36 projects laterally on opposite sides of the active portion 38, the anchor portion 40 and the first resilient member 42 having outlines approximately matching the piezoelectric element 36. More particularly, the piezoelectric element 36 is configured as a circular disk having a diameter d, the anchor portion 40 having a nearly matching outline. The beam member 30, having a uniform thickness $T_1$, extends at a width W from a beam end extremity 44 to the anchor portion 40, the foot portion 34, the active portion 38, and a connecting portion 46, the connecting portion 46 being located at a distance A from the end extremity 32. The piezoelectric element 36 is located at a distance B from the beam end extremity 44, the foot portion 34 extending a distance C within the distance B from the end extremity 44. The first resilient member 42, having a thickness $T_2$ and an outline closely conforming to the diameter d, is also bonded to the anchor portion 40 of the beam member 30, as well as to the element 36.

It has been discovered that the above-described configuration of the beam member 30, wherein the width W is less than the diameter d, the piezoelectric element 36 projecting on opposite sides of the active portion 38 from the width W, desirably enhances the signal from the device 10 by removing overtones associated with secondary flexure modes of the beam member 30 and the element 36. This has been confirmed by initial comparative tests of an experimental prototype of the device 10 with an earlier such prototype having a circular enlargement of the active portion of the beam member 36 that extended to slightly inside the diameter d. In the initial comparative tests, the element 36 was a 20 mm bender piezo model 7BB-20-6, available from Murata Erie, of Smyrna, Ga., the diameter d being 0.8 inch. The thickness $T_1$ of the beam member 30 was approximately 0.010 inch, the width W was approximately 0.375 inch, the distance A was approximately 1.0 inch, the distance approximately 0.15 inch, and the distance C was approximately 0.08 inch. The thickness $T_2$ of the first resilient member 42 was approximately 0.25 inch, the anchor portion 40 being adhesively bonded directly to the arm member 26.

In continued development of the present invention, a second resilient member 48 in the form of an adhesive foam strip is interposed between the arm member 26 and the anchor portion 40 of the beam member 30, further enhancing the clarity of the signal from the device 10. A suitable material for the second resilient member 48, having a thickness $T_3$ of approximately 0.06 inch, is polyethylene foam tape, available from Arlon, of Santa Ana, Calif.

The piezoelectric element 36 has signal leads 50 extending therefrom to a jack assembly 52 for connection to external devices in a conventional manner, the jack assembly 52 including a potentiometer 54 connected in parallel with the element 36 for adjustably attenuating the signal. An exemplary form of the potentiometer 54 has a resistance of 10 k ohms.

Figure 5:
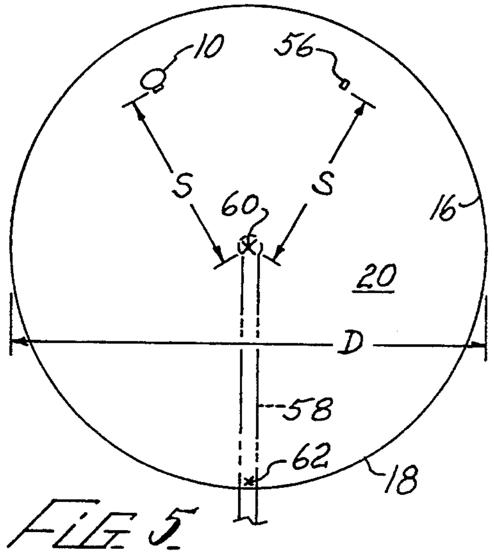
FIG. 5 is a plan diagram of a drum test set-up for the device of FIG. 1 and a comparison trigger device.

With further reference to FIGS. 5–10, an experimental prototype of the device 10 as shown and described above was subjected to a series of comparative tests with prior art devices. As shown in FIG. 5, the device 10 of the present invention was installed on the drum 18 in symmetric relation to a comparison device 56 within a head diameter D of the drum 18, the devices 10 and 56 being simultaneously monitored by a dual channel storage oscilloscope (not shown). The drum 18 was struck using a conventional drumstick 58 against the head 20 as indicated at 60, equidistant at a distance S from piezoelectric elements of the respective devices 10 and 56. In each test, the device 10 was monitored on oscilloscope Channel 1, the comparative device 56 being monitored on Channel 2.

Figure 6:
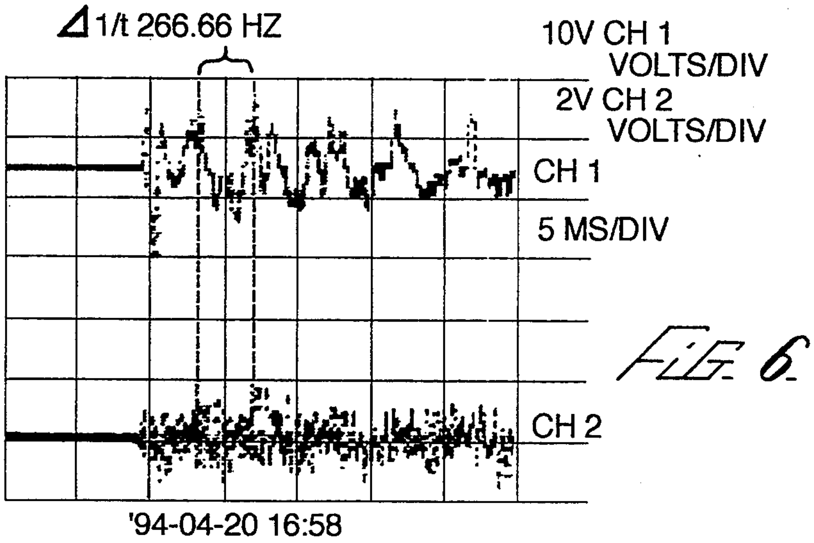
FIG. 6 is a first comparative test oscillogram.

With particular reference to FIG. 6, a first comparative test was with the drum 18 being a brass shell snare drum of 5 inch thickness, the diameter D being 13 inches, the comparative device 56 being a dDrum trigger as disclosed in European Patent Application No.

92850264, Publication No. 0,542,706 A1, the distance S being 5.5 inches from the center of the head 20. The drum was struck at a medium-loud volume with a medium drum stick 58, without hitting the rim. As shown in FIG. 6, the device 10 exhibits an improvement in signal amplitude approximately by a factor of 10 (10/2 in volts per division and at least double trace amplitude), but with relatively greatly diminished high frequency content. The very large component at fundamental frequency (267 Hz in FIG. 6) and diminished high frequency content is highly advantageous in triggering applications in that typical trigger interfaces generate a response signal at 1.3 to 6 ms from the onset of the signal from the triggering device, the signal from the device 10 being markedly clearer during this interval. Further, many newer trigger interfaces have means for analyzing transient waveform patterns using "fundamental frequency identification" to produce an enhanced time base by rejecting frequencies other than the drum's natural frequency (or multiple thereof), the large signal amplitude from the device 10 at the fundamental frequency of the drum 18 facilitating such processing. Moreover, the clear large amplitude signal produced by the device 10 allows use with a wide variety of existing equipment to be triggered therefrom. Further, neither the piezoelectric element 36 nor other component of the device 10 of like area contacts the head 20; accordingly, the sound output from the head 20 is dampened or attenuated to a materially lesser extent during use of the device 10 alone than during use of the comparative device 56 alone.

Figure 7:
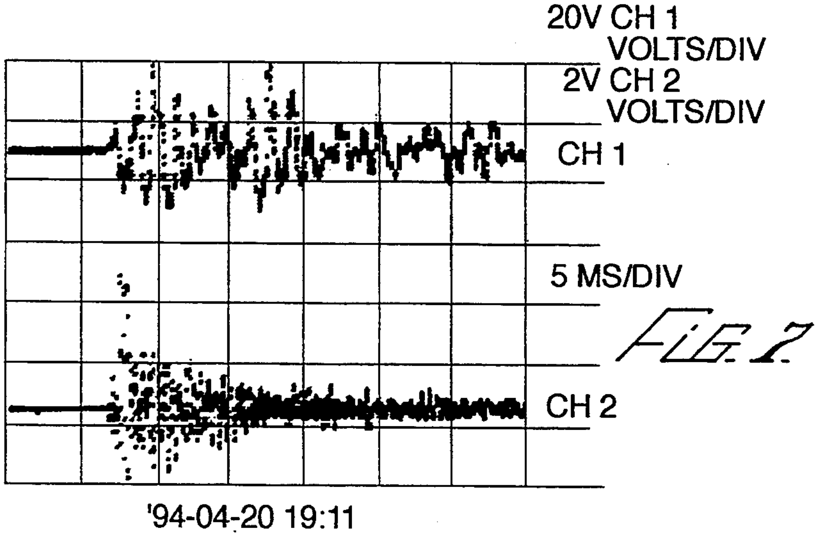
FIG. 7 is a second comparative test oscillogram.

Similarly, and with particular reference to Fig. 7, a second test was performed using a "rim shot" wherein the drumstick 58 simultaneously strikes the drumhead at 60 as in the first test, but together with the bezel ring 16 as indicated at 62, using the medium drum stick at loud volume, the other parameters being the same. The signal from the device 10 was again markedly stronger and clearer, particularly within the period from 1.3 to 6 ms from the onset of the signal.

Figure 8:
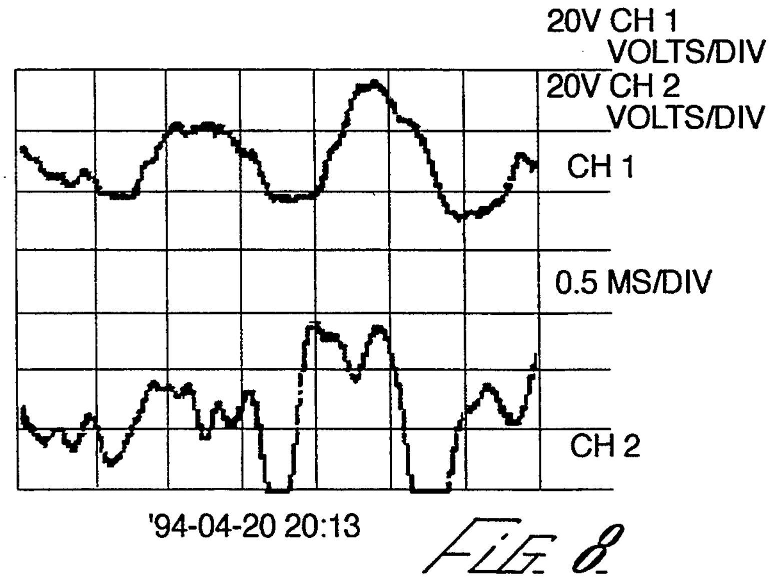
FIG. 8 is a third comparative test oscillogram.

With particular reference to FIG. 8, a third test was performed as in the second test, with a round piezoelectric element pressed against the head 20 as the comparison device 56, the distance S being increased to approximately 9 inches by striking the head 20 at medium volume (simultaneously with the ring 16) at the point 62 being located near the edge of the head 20. FIG. 8 shows (with the horizontal scale expanded to 0.5 ms per division from 5 ms per division in the first two tests) similar signal amplitudes but unwanted high frequency components from the comparison device 56. The piezoelectric element of the comparison device 56 was identical to the element 36 of the device 10. Importantly, there is 25 times greater area contact between the head 20 and the comparison device 56 than there is with the device 10 of the present invention, the comparison device 56 significantly muffling (dampening) the natural ring of the drum. It will be appreciated that the comparative tests were done with both devices contacting the head 20 simultaneously. Consequently, it is expected that the device 10 used alone is even more advantageous relative to the comparison device 56 used alone.

Figure 9:
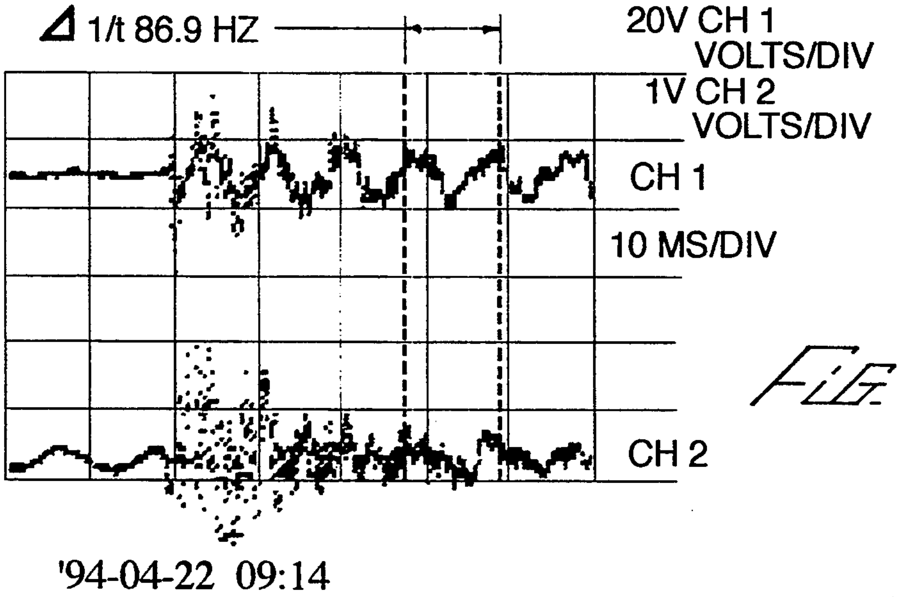
FIG. 9 is a fourth comparative test oscillogram.

With particular reference to FIG. 9, a fourth test was done using an 8 inch deep wood shell tom drum 18, the diameter d being 12 inches, the point 60 being in the center of the head 20, struck at loud volume with the distance S being approximately 4 inches. Tom drums offer a clear pitch than snare drums, because snare drums have wire snares stretched across the bottom, producing a high frequency "sizzle" sound at frequencies ranging from about 10 KHz upward, and because they also choke the ring of the bottom head, thus altering the natural ring of the top head by means of the air column The drum 18 was pitched at "F" which is 87 Hz in this octave. The comparison device 56 was a head contact drum trigger model SC-10, affixed to the head 20 with double-sided tape, slight pressure also being applied using a model HCC-1 trigger clip, both devices being available from Trigger Perfect, Inc. of Tualatin, Oreg.

FIG. 9 shows the device 10 of the present invention reproducing this fundamental frequency substantially clearer than the comparison device 56. Consequently, the device 10 is particularly advantageous for use with interfaces having fundamental frequency identification characteristics as discussed above in connection with the first comparative test (FIG. 6).

Figure 10:
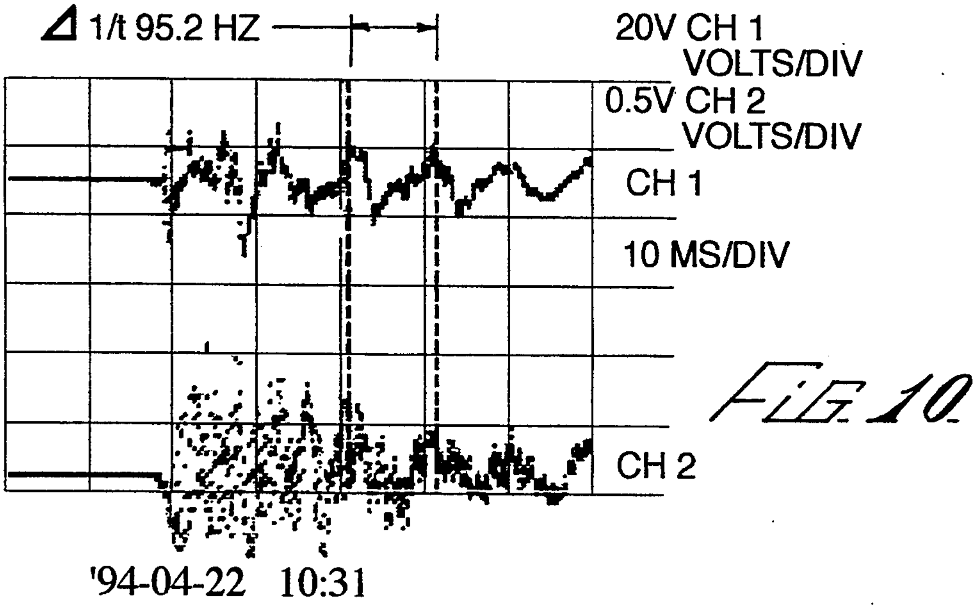
FIG. 10 is a fifth comparative test oscillogram.

With particular reference to FIG. 10, a fifth test was performed as in the fourth test, but with the dDrum trigger described above in place of the SC-10 trigger as the comparison device 56. The results show reduced signal amplitude (slightly greater trace amplitude with double the gain) but relatively more high frequency components in the comparison device 56 and a higher degree of damping than in the fourth test. Also, the measured natural frequency increased to 95.2 Hz.

The device 10 can be used with other musical instruments. In the case of an acoustic guitar, the foot portion 34 of the beam member 30 can be supported in contact with a body portion of the guitar proximate the bridge, the device 10 being mounted to a foundational side wall portion, inside the body.

Although the present invention has been described in considerable detail with reference to certain preferred versions thereof, other versions are possible. For example, the potentiometer 54 can be omitted. Also, the device 10 is useful as an audio transducer, particularly with the potentiometer 54 removed or disconnected. Therefore, the spirit and scope of the appended claims should not necessarily be limited to the description of the preferred versions contained herein.

What is claimed is:

1. A triggering transducer for signaling external equipment from an acoustic device having a foundational structure and an acoustic member, the transducer comprising:

(a) a base for mounting to the foundational structure;

(b) an elastic beam member having an anchor portion supported relative to the base and having a beam extremity for limited area contact with the acoustic member; and (c) a piezoelectric element attached to an active portion of the beam member between the beam extremity and the anchor portion for coupling bending strain from the beam member to the piezoelectric element in response to vibration of the acoustic member, the piezoelectric element being in proximate facing contact with the active portion and extending laterally beyond opposite sides of the beam member for enhanced dynamic response of the element.

2. A triggering transducer for signaling external equipment from an acoustic device having a foundational structure and an acoustic member, the transducer comprising:

(a) a base for mounting to the foundational structure;

(b) an elastic beam member having an anchor portion supported relative to the base and having a beam extremity for limited area contact with the acoustic member; and (c) a circular piezoelectric wafer attached to the beam member between the beam extremity and the anchor portion and extending laterally on opposite sides of the beam member, the piezoelectric wafer having a diameter D and having facing proximate contact with the beam member over a width W of the beam member, the width W being not more than approximately 50 percent of the diameter D, for coupling bending strain from the beam member to the piezoelectric wafer in response to vibration of the acoustic member and for enhanced dynamic response of the wafer.

3. The transducer of claim 2, wherein the width W is approximately half of the diameter D.

4. A triggering transducer for signaling external equipment from an acoustic device having a foundational structure and an acoustic member, the transducer comprising:

(a) a base for mounting to the foundational structure;

(b) an elastic beam member having an anchor portion supported relative to the base and having a beam extremity for limited area contact with the acoustic member, the beam member having a beam width between the anchor portion and the beam extremity; and (c) a piezoelectric element attached to the beam member between the beam extremity and the anchor portion and extending laterally on opposite sides of the beam member, and piezoelectric element having an element width in the direction of the beam width, the beam width being approximately half of the element width, for coupling bending strain from the beam member to the piezoelectric element in response to vibration of the acoustic member and for enhanced dynamic response of the element.

5. The transducer of claim 1, wherein the active portion is inclined at an angle $\theta$ from the acoustic member.

6. The transducer of claim 5, further comprising a first resilient member connected to the piezoelectric element or to the active portion of the beam member proximate the piezoelectric element, for damping the element.

7. A triggering transducer for signaling external equipment from an acoustic device having a foundational structure and an acoustic member, the transducer comprising:

(a) a base for mounting to the foundational structure;

(b) an elastic beam member having an anchor portion supported relative to the base and having a beam extremity for limited area contact with the acoustic member, the beam member being U-shaped between the anchor portion and the active portion;

(c) a piezoelectric element attached to the beam member between the beam extremity and the anchor portion for coupling bending strain from the beam member to the piezoelectric element in response to vibration of the acoustic member, the piezoelectric element being in proximate facing contact with an active portion of the beam member, the active portion being inclined at an angle $\theta$ from the acoustic member; and (d) a first resilient member connected to the piezoelectric element or to the active portion of the beam member proximate the piezoelectric element, the first resilient member being located between the active and anchor portions of the beam member and connecting the anchor portion of the beam member or structure fixedly associated with the anchor portion, for damping the element.

8. The transducer of claim 7, wherein the first resilient member comprises a foam material.

9. The transducer of claim 7, wherein the first resilient member is bonded over substantially the entire face area of the piezoelectric element.

10. The transducer of claim 5, wherein the angle $\theta$ is between approximately 30° and approximately 45°.

11. The transducer of claim 10, wherein the angle $\theta$ is approximately 35°.

12. The transducer of claim 1, further comprising an arm member, the arm member being adjustably fixable relative to the base, the beam member being supported relative to the arm member.

13. The transducer of claim 12, further comprising a second resilient member connecting the anchor portion of the beam member to the arm member.

14. The transducer of claim 13, wherein the second resilient member comprises a foam patch.

15. The transducer of claim 1, further comprising a resilient member connecting the anchor portion of the beam member to a member fixedly supported relative to the base.

16. A triggering transducer for signaling external equipment from an acoustic device having a foundational structure and an acoustic member, the transducer comprising:

(a) a base for mounting to the foundational structure;

(b) an elastic beam member having an anchor portion supported relative to the base and having a beam extremity for limited area contact with the acoustic member;

(c) a piezoelectric element attached to the beam member between the beam extremity and the anchor portion for coupling bending strain from the beam member to the piezoelectric element in response to vibration of the acoustic member, the piezoelectric element being in proximate facing contact with an active portion of the beam member, the active portion being inclined at an angle $\theta$ from the acoustic member, the angle $\theta$ is between approximately 30° and approximately 45°;

(d) a first resilient member bonded over substantially the entire face area of the piezoelectric element for damping the element, the beam member being U-shaped between the anchor portion and the active portion, the first resilient member being located between the active and anchor portions of the beam member and connecting the anchor portion of the beam member;

(e) an arm member, the arm member being adjustably fixable relative to the base; and (f) a second resilient member supportively connecting the anchor portion of the beam member to the arm member.

* * * * *